US012695462B2

(12) United States Patent
Tolic et al.

(10) Patent No.: US 12,695,462 B2
(45) Date of Patent: Jul. 28, 2026

(54) TEMPERATURE SENSOR

(71) Applicant: ams-OSRAM Asia Pacific Pte. Ltd., Singapore (SG)

(72) Inventors: Ivan Porin Tolic, Graz (AT); Gregor Schatzberger, Graz (AT)

(73) Assignee: ams-OSRAM Asia Pacific Pte. Ltd., Singapore (SG)

( * ) Notice: Subject to any disclaimer, the term of this patent is extended or adjusted under 35 U.S.C. 154(b) by 337 days.

(21) Appl. No.: 18/283,718

(22) PCT Filed: Feb. 28, 2022

(86) PCT No.: PCT/SG2022/050096
§ 371 (c)(1),
(2) Date: Sep. 22, 2023

(87) PCT Pub. No.: WO2022/203594
PCT Pub. Date: Sep. 29, 2022

(65) Prior Publication Data
US 2024/0175763 A1 May 30, 2024

(30) Foreign Application Priority Data

Mar. 24, 2021  (DE) .............................. 102021107392

(51) Int. Cl.
*H03M 3/00* (2006.01)
*G01K 1/02* (2021.01)
*G01K 15/00* (2006.01)

(52) U.S. Cl.
CPC ................ *H03M 3/30* (2013.01); *G01K 1/02* (2013.01); *G01K 15/005* (2013.01); *G01K 2217/00* (2013.01); *G01K 2219/00* (2013.01)

(58) Field of Classification Search
CPC ......... H03M 3/30; G01K 15/005; G01K 1/02; G01K 3/14
See application file for complete search history.

(56) References Cited

U.S. PATENT DOCUMENTS

| | | | |
|---|---|---|---|
| 7,914,204 B2 | 3/2011 | Kim et al. | |
| 8,931,953 B2 | 1/2015 | Law et al. | |
| 9,068,896 B2 | 6/2015 | Yun et al. | |

(Continued)

FOREIGN PATENT DOCUMENTS

| | | | |
|---|---|---|---|
| DE | 102013101490 A1 | 8/2013 | |
| JP | 2016111522 A | 6/2016 | |

(Continued)

OTHER PUBLICATIONS

International Search Report and Written Opinion issued in corresponding International Application No. PCT/SG2022/050096 dated May 30, 2022.

*Primary Examiner* — Joseph J Lauture
(74) *Attorney, Agent, or Firm* — ArentFox Schiff LLP

(57) ABSTRACT

A temperature sensor comprises a first oscillator to provide a first oscillation signal having a frequency that increases with increasing temperature and a second oscillator to provide a second oscillation signal having a frequency that decreases with increasing temperature. A time domain sigma-delta modulator is coupled to the first and the second oscillator to receive one of the first oscillation signal and the second oscillation signal to generate an output signal including a bitstream.

15 Claims, 6 Drawing Sheets

(56) References Cited

U.S. PATENT DOCUMENTS

| | | | |
|---|---|---|---|
| 10,247,621 B1 | 4/2019 | Partridge | |
| 2008/0238563 A1 | 10/2008 | Kim et al. | |
| 2009/0058543 A1 | 3/2009 | Gyoten et al. | |
| 2014/0269839 A1 | 9/2014 | Tai et al. | |
| 2015/0063403 A1* | 3/2015 | Cho | G01K 15/005 |
| | | | 374/1 |
| 2018/0313699 A1 | 11/2018 | Vaiana et al. | |
| 2019/0056724 A1 | 2/2019 | Fan | |

FOREIGN PATENT DOCUMENTS

| | | | |
|---|---|---|---|
| KR | 10-1232207 B1 | 2/2013 | |
| KR | 101913614 B1 | 1/2019 | |
| WO | 2020003246 A1 | 1/2020 | |

* cited by examiner 330, 320, 310

430, 420, 410

1110

1111

1112

1113

TEMP[N-1:0]

TEMPERATURE SENSOR

CROSS-REFERENCE TO RELATED APPLICATIONS

This application is a 35 U.S.C. § 371 National Phase Application of PCT Application No. PCT/SG2022/050096 filed Feb. 28, 2022, which claims priority to German Application No. DE 10 2021 107392.8, filed Mar. 24, 2021, entitled "TEMPERATURE SENSOR," the contents of which are hereby incorporated by reference herein in their entireties.

TECHNICAL FIELD

The present disclosure relates to a temperature sensor. Specifically, the present disclosure relates to a temperature sensor including first and second oscillators having different temperature dependencies and a digital circuit to evaluate the oscillator signals. The present disclosure also relates to an integrated circuit that includes a temperature sensor.

This application claims priority of German Patent Application No. 102021107392.8, the disclosure content of which is incorporated herein by reference.

BACKGROUND

Temperature sensors are widely used in integrated circuits to control operation in dependence on temperature. The temperature sensor may be included in the thermal management of the chip, for example, to enable or disable functions in response to the chip temperature. In other applications, the temperature sensor may be used to calibrate functions on the chip such as the frequency of oscillators or phase-locked loops.

Temperature sensors may use different concepts of operation. Some temperature sensors use voltage domain signals that have a predetermined temperature dependency. Other sensors may use time domain-based signals such as clock signals generated by oscillators that have a frequency of predetermined temperature dependency. Digital circuits compare the frequencies of the clock signal to determine temperature information. Both, voltage and time domain temperature sensors may exploit the temperature dependency of a bipolar pn-junction of silicon.

There is a need for a temperature sensor that is robust and provides the temperature information accurately. The temperature sensor circuit should allow full integration on an integrated circuit. The temperature sensor should use as many digital circuit components as possible to allow a circuit that is scalable to different circuit technologies and facilitate monolithic integration in an integrated circuit.

It is an object of the present disclosure to provide a temperature sensor that operates more accurately.

It is another object of the present disclosure to provide a temperature sensor that operates fully digitally.

It is yet another object of the present disclosure to provide an integrated circuit that has a more accurate temperature control.

SUMMARY

One or more of the above-mentioned objects are achieved by a temperature sensor according to the features of present claim 1.

According to an embodiment, a temperature sensor comprises a first oscillator that is operable and configured to provide a first oscillation signal that has a frequency that increases with increasing temperature. A second oscillator is operable and configured to provide a second oscillation signal that has a frequency that decreases with increasing temperature. A time domain sigma-delta modulator is coupled to the first and the second oscillators so as to receive the first and second oscillation signals. The time domain sigma-delta modulator is operable and configured to generate an output signal that includes a bitstream which is indicative of the temperature.

The time domain sigma-delta modulator comprises a multiplexer arrangement that is coupled to the output terminals of the first and second oscillators and is operable and configured to selectively forward one of the first and the second oscillation signals. Multiplexing is performed in dependence on the bitstream from the output signal of the sigma-delta modulator. At one digital value of the bitstream, the first oscillator signal is selected, at the other value of the bitstream, the second oscillator signal is selected.

The time domain sigma-delta modulator further comprises a counter downstream of the multiplexer arrangement that receives either the first or the second oscillation signal from the multiplexer and performs a counting operation. The counting operation is in a first counting direction when the first oscillation signal is forwarded by the multiplexer and is in another counting direction when the second oscillator signal is forwarded by the multiplexer. The first and second directions are different from each other such that one is an up-counting and another one is a down-counting. The first direction may be an up-counting with a first increment value and the second direction may be a down-counting with a second increment different from the first increment. The up-counting and down-counting increments may be integer values such as $\alpha$ or $\beta$. In a sample embodiment, $\alpha=3$ and $\beta=2$, wherein other digital values are also useful. In general, the up and down counting increments may be real numbers which, however, require more complex up/down counter circuits.

The sigma-delta modulator further comprises a latch such as a clock-driven D-flipflop which is connected to an output terminal of the counter. The latch is operated by a clock signal and receives one or more bits from the counting value of the counter. In one embodiment, the counter may be an M-bit counter and the most significant bit of the counting value may be forwarded to the latch. The M-bit counter has a predetermined starting value after initialization of the circuit to start the up/down counting operation. The starting value may be $2^{M-1}-1$ which is a digital number having a zero "0" at the most significant bit and all ones "1" at all other bits such a "0111 . . . 1" which is M bits wide.

The output of the latch provides a bitstream at the frequency of the clock signal applied to the latch. The bitstream includes ones and zeros, "1" and "0", and indicates information about the temperature detected by the sensor. In an embodiment, the density of ones (or alternatively zeros) within the bitstream or the relation between ones and zeros in the bitstream is indicative of the temperature. Said bitstream is fed back to the multiplexer arrangement disposed upstream of the up/down counter to determine whether the first or the second oscillation signal is forwarded to the up/down counter. For example, when the bitstream signal is equal to "1", the second oscillation signal is forwarded to the up/down counter for a down counting operation, and when the bitstream signal is "0", the first oscillation signal is forwarded to the up/down counter for an up counting operation. Embodiments may exist with complementary orientation and control concerning bitstream value and application of first and second oscillation signal to up/down counter.

A filter circuit may be connected downstream of the latch to perform a filtering operation on the bitstream signal. The filtering operation generates a digital code, such as a data word, that is representative of the temperature and that can be forwarded to processors or other digital circuits for further treatment, processing and control. The filter circuit may be a counter to generate a digital output code. The counter may be a clock-driven counter operated by the clock signal from the latch or another clock signal and may receive the bitstream at its enable terminal. When the bitstream is "0", the counting operation of the counting is disabled, when the bitstream is "1", the counting operation is enabled at the rate of the clock signal applied to the counter. In another embodiment, the counter may be a digital low pass filter that generates a digital word from the bitstream. In yet another embodiment, the digital filter may be a digital SINC filter such as a higher order SINC filter such as a $SINC^2$ filter which is a special realization of a low pass filter having a symmetrical triangular response in the time domain. A $SINC^2$ filter can be easily realized with digital circuitry.

With regard to the first and second oscillators, both oscillators have a linear temperature dependency. The first oscillator may be operable and configured to provide the first oscillation signal with a frequency that increases linearly with increasing temperature. The first oscillator may have a PTAT (proportional to absolute temperature) frequency dependency. The second oscillator may be operable and configured to provide a second oscillation signal with a frequency that decreases linearly with increasing temperature. The second oscillator may have a CTAT (complementary to absolute temperature) frequency behavior. Different circuit embodiments are available to realize PTAT and CTAT frequency dependencies of the first and second oscillation signals. The circuit embodiments may differ in the accuracy of linearity and the range of frequencies and the range of temperatures within which a defined amount of linearity is achieved. The PTAT and CTAT oscillators may be ring oscillators having at least three or an odd number of more than three inverting stages serially connected with each other to form a ring configuration. At least one or all of the cells may be controlled with a temperature-dependent signal having progressive or degressive temperature dependency. In an embodiment, all stages of the first oscillator may have the same configuration or may be identical. The same applies to the second oscillator that may have stages having all the same configuration or that may be identical to each other.

According to an embodiment, the first and second oscillators each comprise a ring oscillator having at least three stages connected serially with each other. The first oscillator comprises a ring oscillator including at least three serially connected stages, wherein each stage comprises a latch and first and second transistors configured to receive complementary input signals and a first biasing transistor connected in parallel to the first transistor and a second biasing transistor connected in parallel to the second transistor. The first and second biasing transistors are controlled by a signal increasing with temperature such as a PTAT voltage signal. The second oscillator comprises a ring oscillator including at least three serially connected stages, wherein each stage comprises a latch and first and second transistors configured to receive complementary input signals and a first biasing transistor connected serially to the first transistor and a second biasing transistor connected serially to the second transistor. The first and second biasing transistors are controlled by a signal decreasing with temperature such as a CTAT voltage signal.

Accordingly, the first and second ring oscillators comprise a latch with input transistors and additional bias transistors connected either to ground potential or to supply potential to add or remove current from the latch. This current increases with temperature so that the desired PTAT or CTAT temperature dependency is achieved.

According to another alternative embodiment, the first oscillator may have a ring oscillator configuration including at least three serially connected stages, wherein each stage comprises a latch and first and second transistors configured to receive complementary input signals. A first biasing transistor is connected between the latch and a terminal for ground potential and a second biasing transistor is connected between the latch and a terminal for supply potential. The first biasing transistor is controlled by a signal increasing with temperature (PTAT) and the second biasing transistor is controlled by a signal decreasing with temperature (CTAT).

The second oscillator is configured as a ring oscillator having at least three serially connected stages, wherein each stage comprises a first latch and first and second transistors configured to receive complementary input signals. A second latch is cascaded with the first latch and includes first and second transistors configured to receive the complementary input signals as well. A first biasing transistor is connected between the first latch and the terminal for ground potential and a second biasing transistor is connected between the second latch and the terminal for supply potential. The first biasing transistor is controlled by a signal increasing with temperature (PTAT) and the second biasing transistor is controlled by a signal decreasing with temperature (CTAT). A third and a fourth biasing transistor are connected in a feedback path of the second latch, the third and fourth feedback biasing transistors are controlled by the signal increasing with temperature (PTAT).

The bias signals to be supplied to the ring oscillator stages are generated in a bias circuit that exploits the temperature dependency of a bipolar pn-junction. Several circuit configurations are available to generate bias voltages with positive or negative temperature coefficient, that is rising with rising temperature or falling with rising temperature. Specifically, the bias circuit may generate voltages having linear, such as PTAT and CTAT, temperature dependency. The bias circuit may include a capacitor that is charged with a voltage from a pn-junction so that the capacitor voltage is temperature-dependent relative to the temperature dependency of the pn-junction. The pn-junction may be a base-emitter-junction of a bipolar transistor. The capacitor may provide the CTAT bias voltage to be forwarded to the corresponding ring oscillator stages. The CTAT voltage may be mirrored to the other potential rail to provide the PTAT bias voltage to be supplied to the corresponding ring oscillator stages.

The above described temperature sensor includes digital circuits that are based on CMOS transistor technology. The circuits can be integrated monolithically into larger integrated circuits that realize complex electronic systems. Such systems may comprise optical sensors, optical proximity sensors, light-to-digital converters, LiDAR circuits, time-to-digital converters, time of flight controllers and others, although the temperature sensor is not limited to these areas of technical application. The temperature sensor is connected to the electronic digital circuit within the integrated circuit to control operation of the circuit in dependence on the measured temperature. The bitstream from the latch or the digital data code from the filter are forwarded to the electronic digital circuit to generate temperature-dependent control measures. This may include the thermal management of the chip such as the enabling or the disabling of the circuit if the temperature is below or above specifications. More than one or several temperature sensors may be positioned at different locations on the integrated circuit to monitor the temperature throughout different circuit areas.

In another field of application, integrated circuits may require a temperature stable time basis so that the temperature signal from the temperature sensor may be applied to an oscillator for temperature calibration of its oscillation frequency. Such oscillators may include PLL (phase locked loop) circuits that receive a digital signal for fine control and temperature calibration of the PLL frequency.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION OF EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
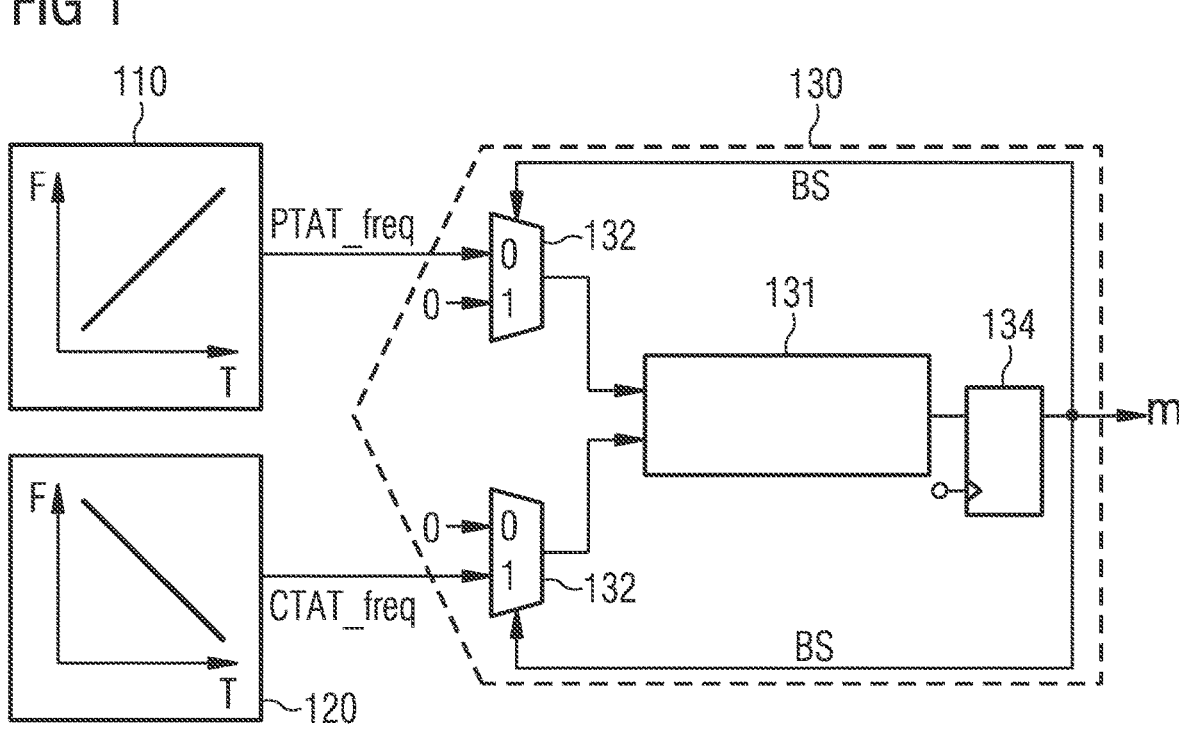
FIG. 1 shows a principle block diagram of a temperature sensor according to the principles of the present disclosure.

A blockdiagram of the temperature sensor is depicted in FIG. 1. The first oscillator 110 produces a PTAT frequency clock signal PTAT_freq, while the second oscillator 120 produces a CTAT frequency clock CTAT_freq. Outputs of the two ring oscillators are joined to provide a ratiometric measurement by a time domain sigma-delta converter 130. Scale factors α and β are used in the sigma-delta converter to achieve a PTAT digital output represented by a scaled PTAT value divided by a NTAT (neutral to absolute temperature) value.

Figure 2:
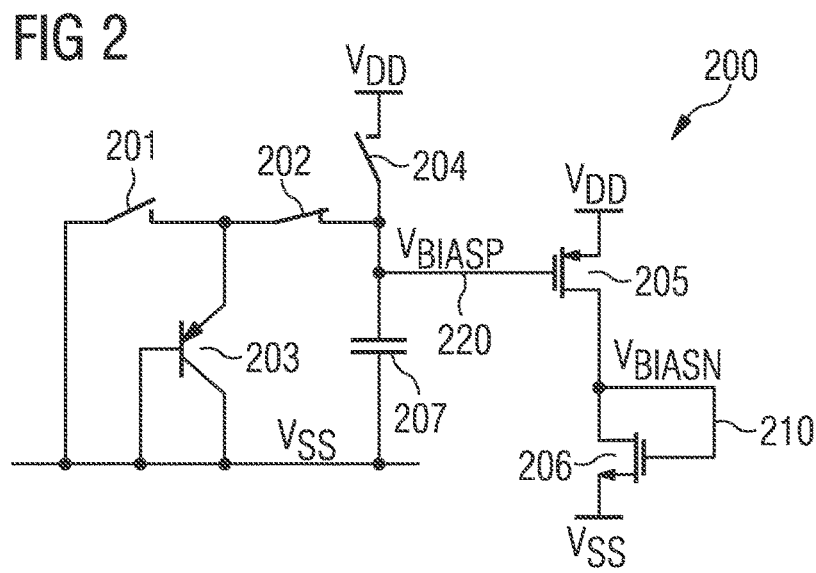
FIG. 2 shows a schematic diagram of a bias generator.

FIG. 2 shows a bias voltage generator. Temperature dependent voltages VBIASN, VBIASP are generated using a bias circuit. During a first phase, the switches 201 and 204 are closed or conductive, and the switch 202 is open or non-conductive. The capacitor 207 is charged to the supply voltage VDD, while the pnp transistor 203 is shorted to the ground potential VSS. During a second phase, the switches 201 and 204 are opened and the switch 202 is closed. The capacitor 207 is discharging through the pnp transistor 203. After a sufficient time interval, the switch 202 is opened and transistor 203 is decoupled from the capacitor 207. In this way, the CTAT voltage VBIASP is generated across the emitter-base junction of transistor 203 and stored on the capacitor 207. The voltage VBIASP is applied to the gate of a MOS transistor 205. The current flowing through the transistor 205 generates a PTAT voltage VBIASN across a diode-connected transistor 206 of which base and drain terminals are connected together. The voltage VBIASN is a bias voltage for the PTAT frequency ring oscillator 110 and the voltage VBIASP is a bias voltage for the CTAT frequency ring oscillator 120. The bias circuit operates dynamically. The capacitor 207 is charged to supply voltage VDD, then, the pn-voltage from bipolar transistor 203 is applied to the capacitor and the capacitor stores the temperature dependent voltage, then, the transistor is decoupled from the capacitor to provide the VBIASP and VBIASN control voltages. The dynamic operation of the bias circuit provides a reliable temperature dependent bias voltage while saving supply power.

Figure 3:
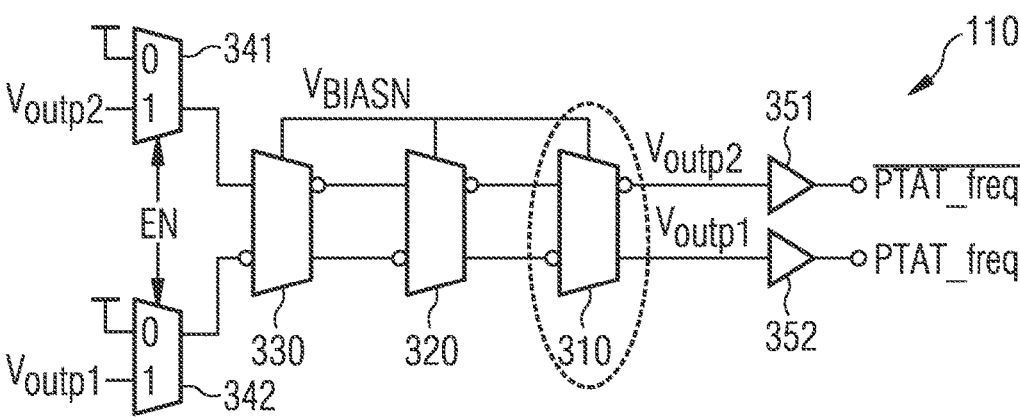
FIG. 3 shows a block diagram of a PTAT ring oscillator.

FIG. 3 shows PTAT ring oscillator 110 in more detail. The oscillator comprises three delay cells 310, 320, 330 in complementary configuration so that a signal and the complementary signal are generated. The signal EN is a select signal for two multiplexers 341, 342. During precharging and discharging of the capacitor 207, EN is "0" and the oscillator does not oscillate as the "1" and "0" are applied to its inputs. After the discharge, EN is equal to "1" and the oscillator oscillates as the outputs of the third stage 310 are applied to the inputs of the first stage via multiplexers 341, 342. The outputs of the third stage are buffered with two buffers 351, 352 to convert them to digital signals/ PTAT_freq and PTAT_freq. The PTAT voltage VBIASN is applied to each of the cells of the ring oscillator.

Figure 4:
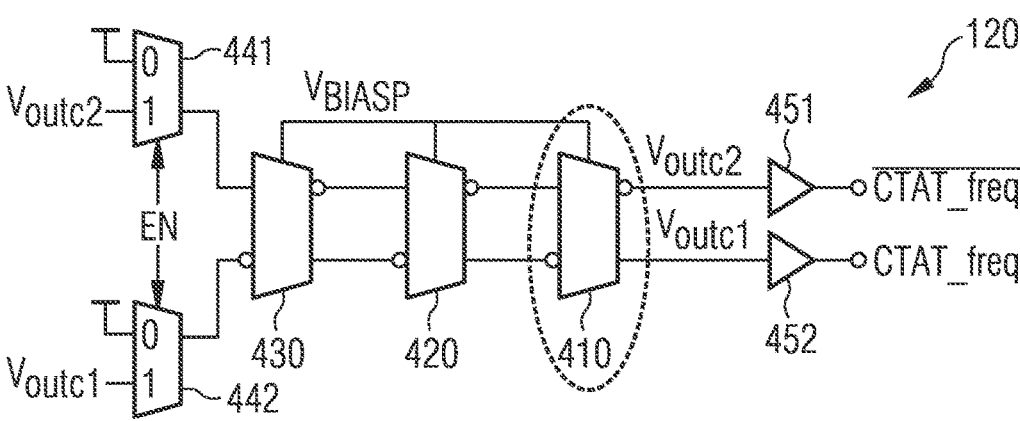
FIG. 4 shows a block diagram of a CTAT ring oscillator.

FIG. 4 shows CTAT ring oscillator 120 in more detail. The oscillator comprises three delay cells 410, 420, 430 in complementary configuration. The signal EN is a select signal for two multiplexers 441, 442. During precharging and discharging of the capacitor 207, EN is "0" and the oscillator does not oscillate as the "1" and "0" are applied to its inputs. After the discharge, EN is equal to "1" and the oscillator oscillates as the outputs of the third stage 410 are applied to the inputs of the first stage via multiplexers 441, 442. The outputs of the third stage are buffered with two buffers 451, 452 to convert them to digital signals/ CTAT_freq and CTAT_freq. The CTAT voltage VBIASP is applied to each of the cells of the ring oscillator.

Figure 6:
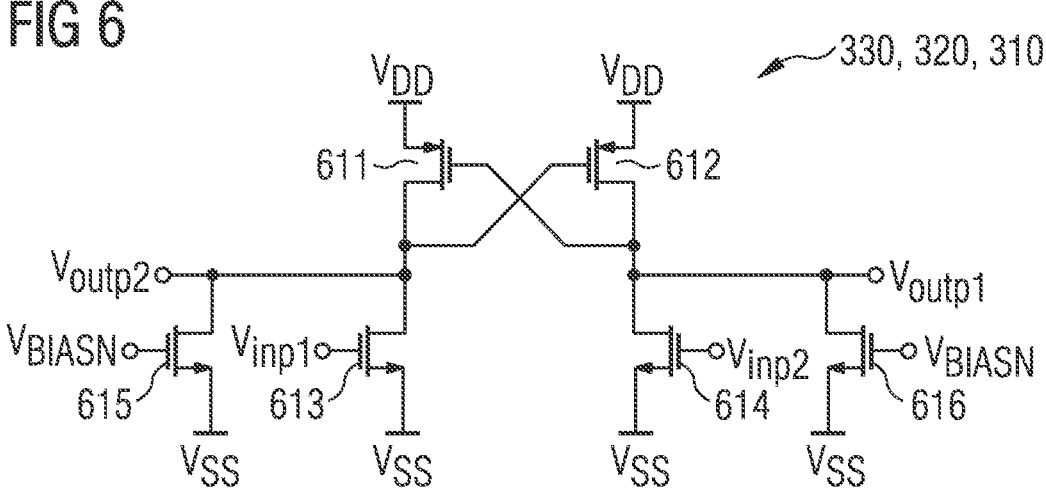
FIG. 6 shows a schematic diagram of a stage of the PTAT ring oscillator.

Turning now to FIG. 6, a cell of the PTAT ring oscillator 110 according to a first embodiment is shown. All three cells 310, 320, 330 of oscillator 110 have the identical structure. The delay cell contains six transistors 611, . . . , 616. The cell includes a latch, formed by transistors 611, 612, 613, 614, wherein transistors 611, 612 are crosscoupled and transistors

613, 614 couple transistors 611, 612 to ground potential terminal VSS. Transistors 615, 616 are biased with the PTAT bias voltage VBIASN at their gate terminals. There are two latch currents, one flowing through transistors 611, 613, the other one flowing through transistors 612, 614. The currents change with the temperature, causing a temperature dependent delay and temperature dependent oscillation frequency. Voltage-controlled transistors 615, 616 draw current from each branch of the latch. The transistors are sized such that the oscillator has a PTAT frequency dependency.

Figure 7:
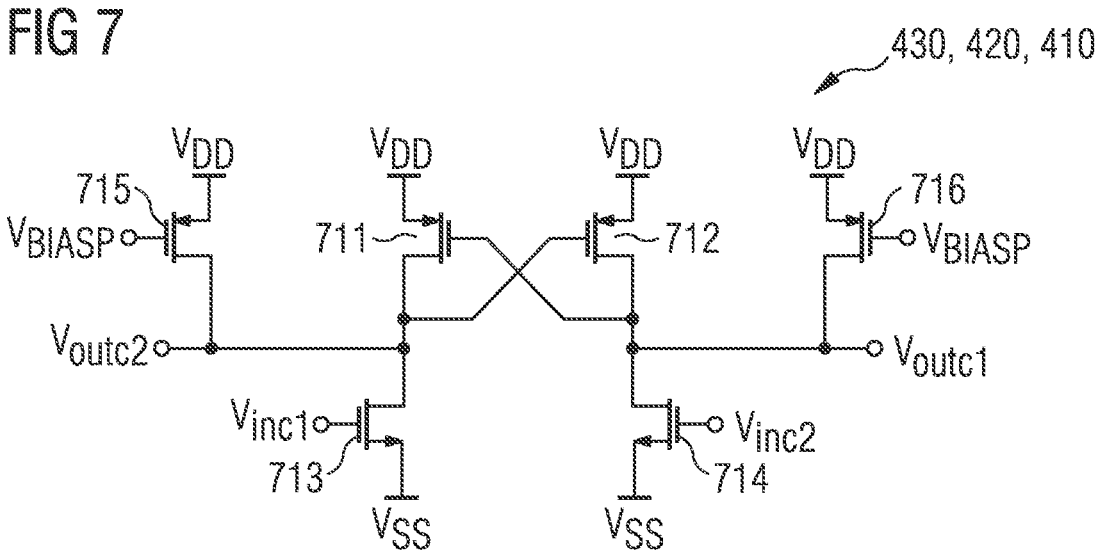
FIG. 7 shows a schematic diagram of a stage of the CTAT ring oscillator.

Turning now to FIG. 7, a cell of the CTAT ring oscillator 120 according to a first embodiment is shown. All three cells 410, 420, 430 of oscillator 120 have the identical structure. The delay cell contains six transistors 711, . . . , 716. The cell includes a latch, formed by transistors 711, 712, 713, 714, wherein transistors 711, 712 are crosscoupled and transistors 713, 714 couple transistors 711, 712 to ground potential terminal VSS. Transistors 715, 716 are biased with the CTAT bias voltage VBIASP at their gate terminals. There are two temperature dependent latch currents, one flowing through transistors 711, 713, the other one flowing through transistors 712, 714. The currents change with the temperature, causing a temperature dependent delay and temperature dependent oscillation frequency. Voltage-controlled transistors 715, 716 draw current from each branch of the latch. The transistors are sized such that the oscillator has a PTAT frequency dependency.

Figure 5:
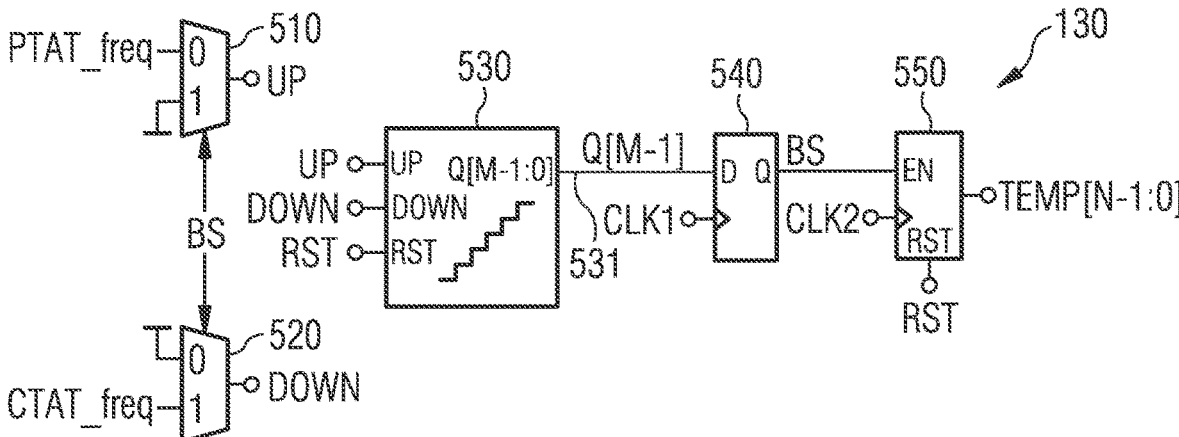
FIG. 5 shows a block diagram of an all-digital sigma-delta modulator.

Turning now to FIG. 5, an embodiment of a all-digital time domain sigma-delta modulator is shown. The in-phase output signals from the ring oscillators 110, 120 present at terminals 352, 452, resp., such as oscillator signals PTAT_freq and CTAT_freq are applied to the multiplexers 510 and 520, resp. The select signal for both multiplexers is the bitstream signal BS which is fed back from the output side of the sigma-delta modulator to the multiplexers 510, 520. When bitstream signal BS is equal to "0", the output signal UP of multiplexer 510 is equal to PTAT_freq and the output signal DOWN of the multiplexer 520 is equal to "0". When bitstream signal BS is equal to "1", signal UP is equal to "0", and signal DOWN is equal to CTAT_freq. The signals UP and DOWN from multiplexers 510, 520 are forwarded within the all-digital time domain sigma-selta converter. The converter is implemented with a digital up/down counter 530. When the rising edge of PTAT_freq comes to the counter input UP, a value $\alpha$ is added to the M-bit accumulator value Q. Similarly, when the rising edge of CTAT_freq comes to the counter input DOWN, a value $\beta$ is subtracted from the M-bit accumulator value Q. The value Q is reset with the active-high reset signal RST during the discharge of capacitor 207. The initial value of the Q is $2^{M-1}-1$, so that the most significant bit is "0", and all others bits are "1". The most significant bit (MSB) of the accumulator value, namely the bit Q[M−1], is applied to a D-flip flop 540. The D-flip flop is clocked with the external clock signal CLK1. The output of the D-flip flop is the bitstream signal BS. A high value of the reset signal RST sets the bitstream signal BS to "0", as the initial value of Q[M−1] is "0". The bitstream BS is applied to the N-bit digital counter 550, which provides a PTAT digital output signal TEMP[N−1:0]. The counter 550 is clocked with the signal CLK2, and the reset signal RST resets the counter.

Clock signal CLK2 can have the same frequency as clock signal CLK1 or can be the identical signal. Clock signals CLK1 and CLK2 can also be different signals having different frequencies.

The average value µ of the output bitstream is equal to:

$$\mu = \frac{\alpha f_{PTAT}}{\alpha f_{PTAT} + \beta f_{CTAT}} = \frac{\alpha f_{PTAT}}{f_{NTAT}} \tag{1}$$

The frequencies can be rewritten as linear functions, so that the PTAT and CTAT frequencies are equal to:

$$f_{PTAT} = A \cdot \text{temp} + B \tag{2}$$

$$f_{CTAT} = -C \cdot \text{temp} + D \tag{3},$$

wherein A>0 and C>0. It is to be noted that the frequency $f_{NTAT}$ (frequency neutral to absolute temperature) is used for this calculation and to demonstrate the validity of the disclosed concept rather than a signal as such in the circuit. Combining (1), (2) and (3), the $f_{NTAT}$ value is achieved, if the following condition is fulfilled:

$$\alpha \cdot A = \beta \cdot C = \, > \frac{\alpha}{\beta} = \frac{C}{A} \tag{4}$$

This relation is exploited in a way that $\alpha$ and $\beta$ are realized as decimal numbers approximating the ratio. These coefficients are used during conversion. The sigma-delta modulator averages the added with the subtracted value. Let $N_D$ be the number of rising edges of the signal DOWN and $N_U$ the number of rising edges of the signal UP. By adding $\alpha$ for each rising edge of UP and subtracting $\beta$ for each rising edge of DOWN, the averaging provides the following:

$$\alpha \cdot N_U = \beta \cdot N_D \tag{5}$$

If the time during which the bitstream is equal to "1" is marked as T1 and the time during which the bitstream is equal to "0" is marked as T0, the average value µ is equal to:

$$\mu = \frac{T1}{T1 + T0} \tag{6}$$

The periods of the oscillators are:

$$T_{f_{PTAT}} = \frac{1}{f_{PTAT}} \tag{7}$$

$$T_{f_{CTAT}} = \frac{1}{f_{CTAT}}, \tag{8}$$

wherein $T_{f_{PTAT}}$ is the period of the PTAT frequency clock and $T_{f_{CTAT}}$ is the period of the CTAT frequency clock. During the value "1" of the bitstream, the CTAT frequency clock is applied to the sigma-delta modulator so that the following expression is valid:

$$T1 = N_D \cdot T_{f_{CTAT}} = \frac{N_D}{f_{CTAT}} \tag{9}$$

Similarly, during the value "0" of the bitstream, the PTAT frequency clock is applied to the sigma-delta modulator so that T0 is equal to:

$$T0 = N_U \cdot T_{f_{PTAT}} = \frac{N_U}{f_{PTAT}} \tag{10}$$

Combining (6) with (9) and (10), μ can be written as:

$$\mu = \frac{\dfrac{N_D}{f_{CTAT}}}{\dfrac{N_D}{f_{CTAT}} + \dfrac{N_U}{f_{PTAT}}} = \frac{N_D \cdot f_{PTAT}}{N_D \cdot f_{PTAT} + N_U \cdot f_{CTAT}} \qquad (11)$$

When inserting (5) into (11), the average value of the bitstream is equal to formula (1), as desired.

The bitstream is applied to the digital counter 550 as an enable signal. When the bitstream BS is equal to "1", the digital counter 550 counts the number of rising edges of the clock signal CLK2. The counter is given as an example of circuit which can provide the digital output by processing the bitstream BS. More general, the counter 550 may be replaced by a digital filter that can be used in general to generate a digital data code TEMP [N−1:0] from the bitstream BS. The digital data code represents the temperature determined by the circuit and can be processed by downstream connected processing circuit or can be used to control temperature dependent tasks in an integrated circuit. Alternatively, counter 550 can be replaced by a low pass filter or by a SINC filter such as a SINC² filter. The additional clock signal CLK2 supplied to counter 550 may be the same signal as clock signal CLK1 supplied to latch 540. In other embodiments, clock signals CLK1, CLK2 can have different frequency. The clock signal CLK2 can have a higher frequency than clock signal CLK1 to improve the oversampling ratio.

Finally, the output digital code TEMP can be written as:

$$TEMP = \mu \cdot \frac{T_{MEAS}}{T_{CLK}}, \qquad (12)$$

wherein $T_{MEAS}$ is the total measurement time and $T_{CLK}$ is the period of clock signal clock CLK2.

Figure 10:
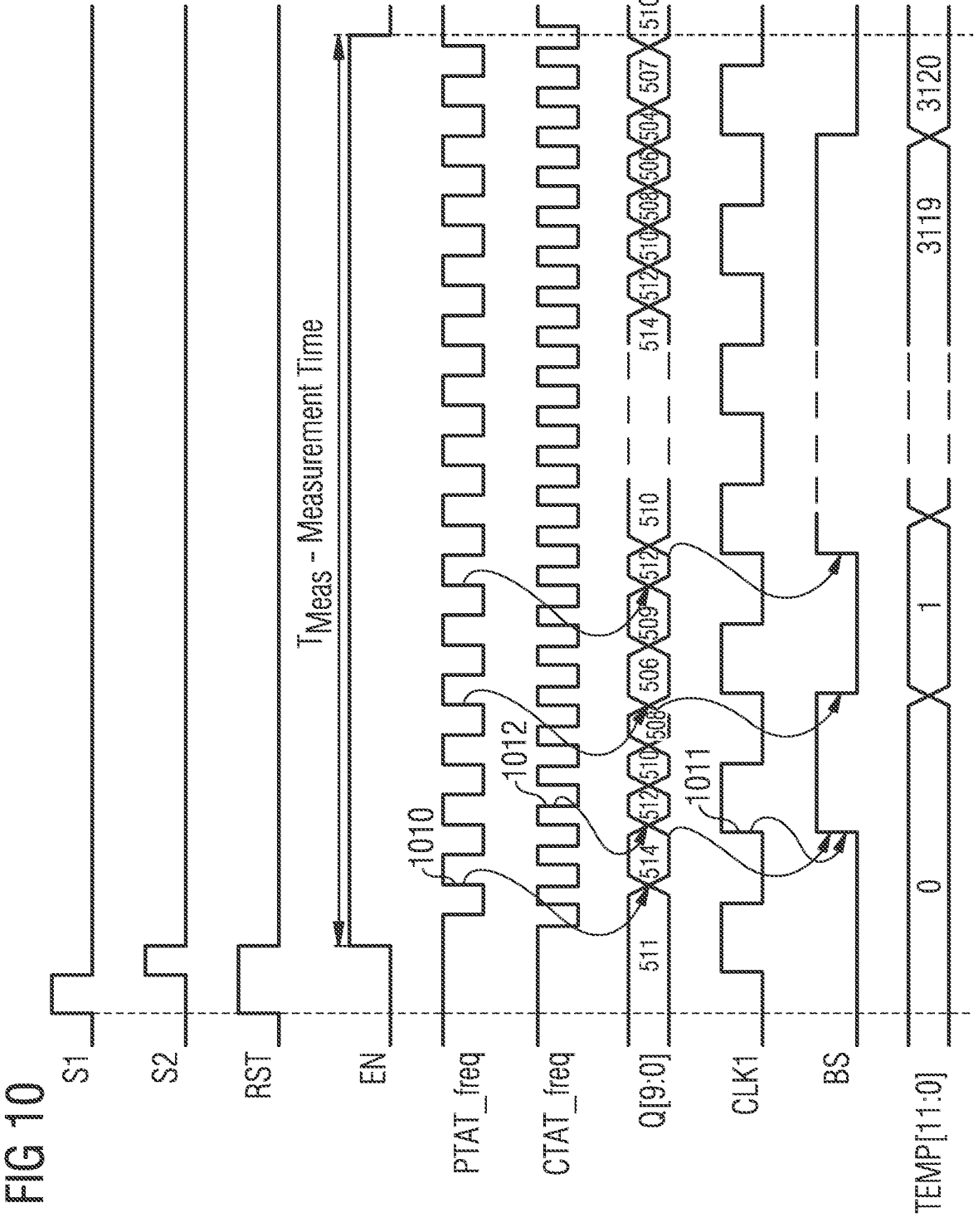
FIG. 10 shows a waveform diagram of signals from FIGS. 1 through 5.

FIG. 10 depicts a timing diagram for the case α=3, β=2, wherein the numbers and bus widths are given just as an example. FIG. 10 shows several signals to illustrate the operation of the circuits shown in FIGS. 1 through 7 during a measurement cycle time $T_{MEAS}$. Operation starts with a counter value Q of 12-bit-counter 530 of Q=511. As the initial value of the bitstream BS is "0", the signal from PTAT oscillator 110 is forwarded through multiplexer 510 to up/down counter 530. The rising edge of the signal PTAT_freq at instant 1010 causes an up-count of counter 530 by α=3 so that the counter output value is Q=514 causing a value "1" of bitstream BS at the rising edge of clock signal CLK1 at instant 1011.

As a result, multiplexers 510, 520 change their state so that the output signal of CTAT oscillator 120 is forwarded to up/down counter 530. The rising edge of the signal CTAT_freq causes a down-count by β=2 of the counter 530 at instant 1012 so that the counter output value is Q=512. This process continues until the measurement time signal $T_{MEAS}$ changes to value "0". During the measurement time, counter value Q makes an up-count by α=3 and a down-count by β=2 in response to rising edges of the PTAT and CTAT oscillator signals which are correspondingly applied to the counter 530 in response to bitstream BS. In the present example, at expiry of the measurement time $T_{MEAS}$, the output value TEMP[11:0] is 3120 which is a digital value that indicates the temperature determined by the circuit.

Figure 8:
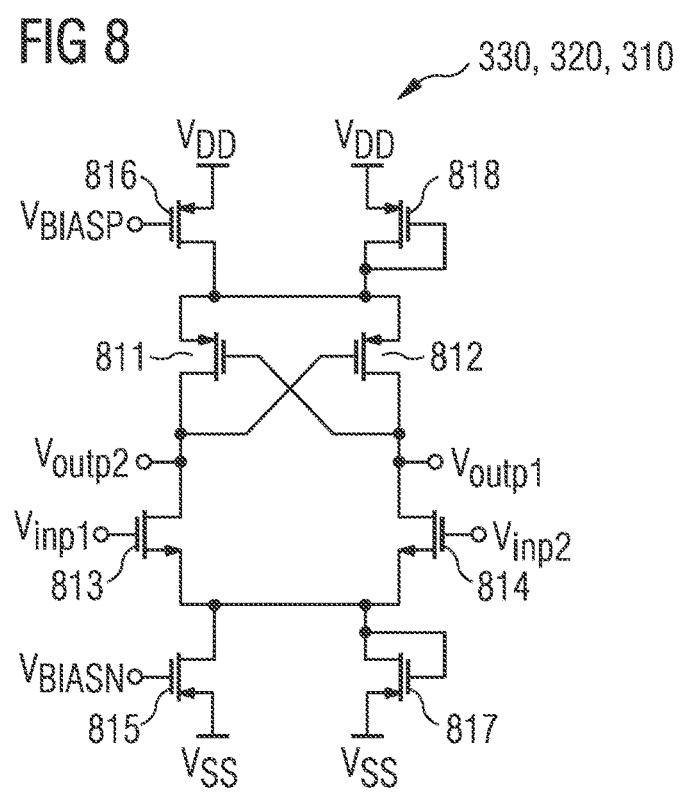
FIG. 8 shows a stage of another embodiment of the PTAT ring oscillator.

The PTAT and CTAT ring oscillator stages shown in FIGS. 6 and 7 may be replaced, in general, by other ring oscillator stages that form a ring oscillator having a linear frequency dependency from temperature which is proportional to absolute temperature and complementary proportional to absolute temperature, respectively. Another example of a PTAT ring oscillator stage that is useful to realize stages 310, 320, 330 of FIG. 3 is depicted in FIG. 8. The stage shown in FIG. 8 includes a latch of cross-coupled PMOS transistors 811, 812. The latch transistors are serially connected to input transistors 813, 814 which receive complementary input signals Vinp1, Vinp2. The output terminals providing complementary output signals Voutp1, Voutp2 are connected to the drain terminals of NMOS transistors 813, 814. The sources of transistors 813, 814 are connected to ground potential terminal VSS through bias transistor 815 which is supplied with the PTAT control voltage VBIASN. A diode connected NMOS transistor 818 is connected in parallel to transistor 815. The high side of the latch is connected through PMOS transistor 816 to supply potential terminal VDD. Transistor 816 is controlled by CTAT bias voltage VBIASP. A diode connected PMOS transistor 818 is connected in parallel to transistor 816. Proper design of the circuit generates a linear PTAT delay time of the stage so that the frequency dependency of a ring oscillator including at least three of the shown cells has PTAT frequency dependency.

Figure 9:
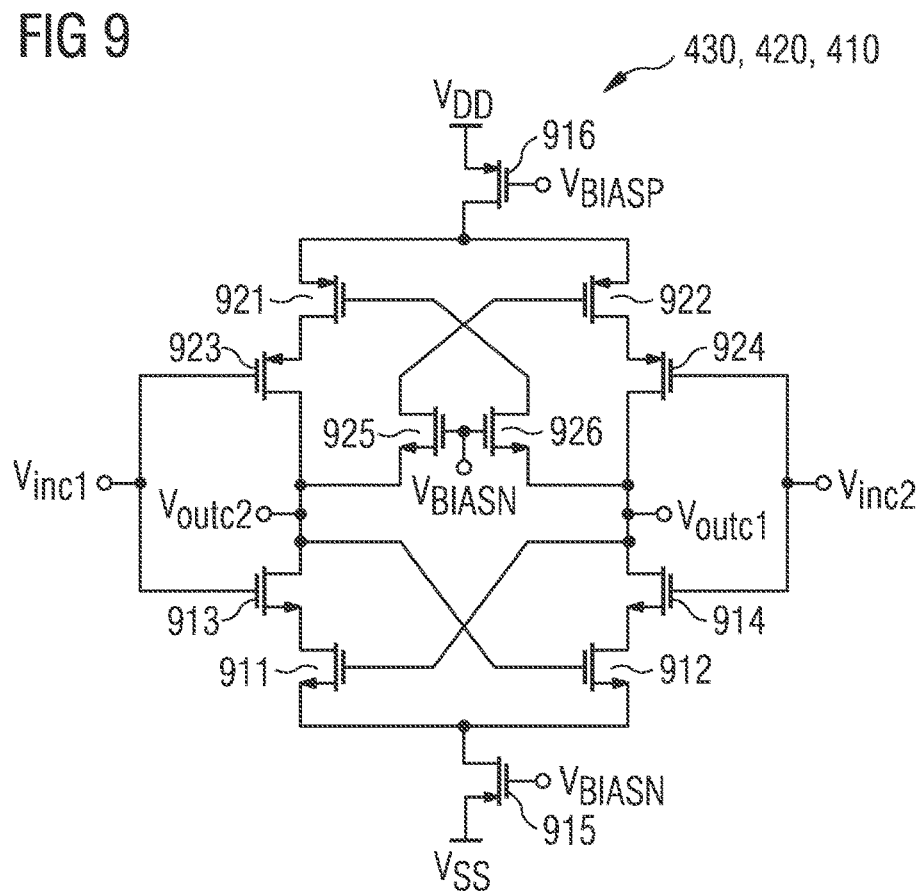
FIG. 9 shows a stage of another embodiment of the CTAT ring oscillator.

FIG. 9 depicts a CTAT ring oscillator stage such as stages 410, 420, 430 of FIG. 4. The ring oscillator stage comprises a first latch of cross-coupled NMOS transistors 911, 912 and input transistors 913, 914. A second latch of cross-coupled transistors 921, 922 and input transistors 923, 924 is cascaded with the first latch. Input transistors 913, 923 are controlled by input signal Vinc1 and input transistors 914, 924 are controlled by complementary input signal Vinc2. The complementary output signals VOUTC1, VOUTC2 are derived from the coupled drain electrodes of transistors 914, 924 and 913, 923, respectively. The transistors 911, 912 of the first latch are connected to ground potential terminal VSS through NMOS transistor 915 controlled by PTAT dependent voltage VBIASN. The transistors 921, 922 of the second latch are connected to supply potential terminal VDD through PMOS transistor 916 controlled by the CTAT dependent voltage VBIASP. Proper design of the circuit ensures a CTAT dependent delay of the stage so that a ring oscillator formed from the depicted stage has CTAT frequency dependency.

Figure 11:
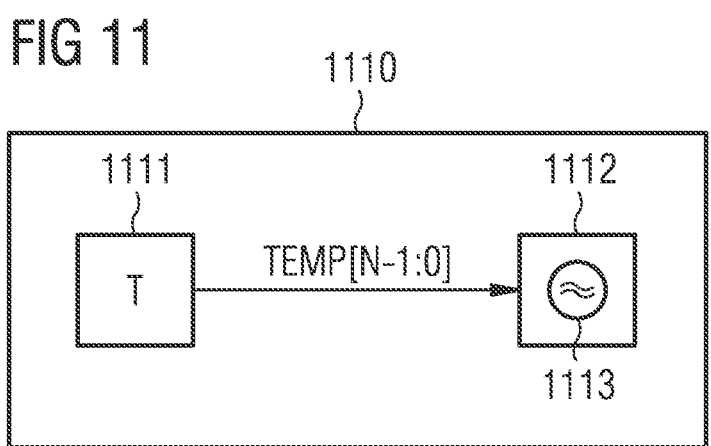
FIG. 11 shows an electronic digital device including a temperature sensor.

Turning now to FIG. 11, the application of the above described temperature sensor in an integrated circuit is shown. An integrated circuit 1110 includes the temperature sensor 1111 described above and an electronic digital circuit 1112 which performs digital signal processing. The digital electronic circuit 1112 may be an optical sensor, an optical proximity sensor, a light-to-digital converter, a time-to-digital converter, a LiDAR circuit, a time of flight controllers or any other digitally operating circuit that requires temperature control. Circuit 1112 is controlled by the output signal TEMP[N−1:0] from temperature sensor 1111. In one embodiment, circuit 1112 or portions thereof may be monitored by temperature sensor 1111. If a target temperature range is exceeded, circuit 1112 or the corresponding portion is disabled. Multiple sensors similar to sensor 1111 may be provided to monitor portions of the circuit 1112.

According to another temperature control concept, digital electronic circuit 1112 includes an oscillator 1113 which may be a voltage controlled oscillator such as a PLL (phase-locked loop). The temperature signal TEMP[N−1:0]

from sensor circuit 1111 controls and calibrates the frequency of oscillator 1113 in dependence on the temperature so that oscillator 1113 provides a temperature stable clock frequency to circuit 1112.

The temperature sensor according to the principes of this disclosure combines the temperature-dependent bias circuit, implemented with a pnp transistor and a capacitor, with two ring oscillators. Temperature-dependent biasing applied to the two ring oscillators relies on the CTAT emitter-base voltage of the pnp transistor. The output frequencies of the two ring oscillators having PTAT and CTAT frequency dependency are combined with the sigma-delta modulator/converter. The control concept uses an all digital sigma-delta modulator, making the circuit more accurate. An all digital implementation of the sigma-delta converter is used to generate a PTAT bitstream. The converter is based on the up/down counter performing weighted counting. Two integer coefficients α, β are used for addition and subtraction during up/down counting with the proper ratio in order to achieve the PTAT digital output signal. The temperature sensor can be combined with CMOS integrated circuits as its realization is all in CMOS circuit technology.

It will be apparent to those skilled in the art that various modifications and variations can be made without departing from the spirit or scope of the disclosure as laid down in the appended claims. Since modifications, combinations, subcombinations and variations of the disclosed embodiments incorporating the spirit and substance of the disclosure may occur to the persons skilled in the art, the disclosure should be construed to include everything within the scope of the appended claims.

LIST OF REFERENCE SIGNS

110, 120 oscillator
130 sigma-delta modulator
201, 202, 204 switch
203, 204, 206 transistor
341, 342 multiplexer
330, 320, 310 ring oscillator
441, 442 multiplexer
510, 520 multiplexer
530 counter
540 flip flop
550 counter
611, . . . , 616 transistor
711, . . . , 716 transistor
811, . . . , 818 transistor
911, . . . , 926 transistor
1110 integrated circuit
1111 temperature sensor
1112 electronic digital circuit
1113 oscillator
BS bit stream
PTAT_freq oscillator signal
CTAT_freq oscillator signal
VBIASN, VBIASP control signal
VDD, VSS potential
CLK1, CLK2 clock signal
Vinc1, Vinc2 input signal
Voutc1, Voutc2 output signal
UP, DOWN up, down pulse
RST reset signal

The invention claimed is:

1. A temperature sensor, comprising:
   a first oscillator operable to provide a first oscillation signal having a frequency that increases with increasing temperature;
   a second oscillator operable to provide a second oscillation signal having a frequency that decreases with increasing temperature; and
   a time domain sigma-delta modulator coupled to the first oscillator and the second oscillator operable to receive the first oscillation signal and the second oscillation signal and configured to generate an output signal including a bitstream.

2. The temperature sensor of claim 1, wherein the time domain sigma-delta modulator comprises:
   a multiplexer arrangement coupled to an output terminal of the first oscillator and an output terminal of the second oscillator configured to selectively forward the first oscillation signal or the second oscillation signal in dependence on the bitstream of the output signal of the time domain sigma-delta modulator;
   a counter coupled to the multiplexer arrangement, configured to perform a counting operation in a first counting direction when the first oscillation signal is forwarded by the multiplexer arrangement and to perform another counting operation in a second counting direction different from the first counting direction when the second oscillation signal is forwarded by the multiplexer arrangement.

3. The temperature sensor of claim 2, wherein the counting operation in the first direction is one of a up counting and a down counting with a first increment and the other counting operation in the second direction is another one of a up counting and a down counting with a second increment different from the first increment.

4. The temperature sensor of claim 2, wherein the time domain sigma-delta modulator further comprises a latch connected to an output terminal of the counter and wherein the latch is operated by a clock signal.

5. The temperature sensor of claim 4, wherein the output terminal of the counter is configured to provide a most significant bit of the counting operations of the counter.

6. The temperature sensor of claim 5, wherein the counter is configured as a M-bit counter and wherein a starting value of the counting operations of the counter is set to a value having one binary digit at the most significant bit and complementary binary digits at other bits.

7. The temperature sensor of claim 2, further comprising a filter circuit connected to the output terminal of the sigma-delta modulator, the filter circuit configured to provide a digital value representative of the temperature.

8. The temperature sensor of claim 7, wherein the filter circuit is a counter or a digital low pass filter or a digital SINC filter.

9. The temperature sensor of claim 1, wherein the first oscillator is operable to provide the first oscillation signal having a frequency that increases linearly with increasing temperature;
   a second oscillator operable to provide a second oscillation signal having a frequency that decreases linearly with increasing temperature.

10. The temperature sensor of claim 9, wherein the first oscillator comprises a ring oscillator including at least three serially connected stages, wherein each stage comprises a latch including first and second transistors configured to receive complementary input signals and a first biasing transistor connected in parallel to the first transistor and a second biasing transistor connected in parallel to the second transistor, the first and second biasing transistors controlled by a signal increasing with temperature, wherein the second oscillator comprises a ring oscillator including at least three serially connected stages, wherein each stage comprises a latch including first and second transistors, configured to receive complementary input signals and a first biasing transistor connected serially to the first transistor and a second biasing transistor connected serially to the second transistor, the first and second biasing transistors controlled by a signal decreasing with temperature.

11. The temperature sensor of claim 9, wherein the first oscillator comprises a first ring oscillator including at least three serially connected stages wherein each stage comprises a latch including first and second transistors configured to receive complementary input signals and a first biasing transistor connected between the latch and a terminal for ground potential and a second biasing transistor connected between the latch and a terminal for supply potential, the first biasing transistor controlled by a signal increasing with temperature and the second biasing transistor controlled by a signal decreasing with temperature.

12. The temperature sensor of claim 11, wherein the second oscillator comprises a second ring oscillator including at least three serially connected stages wherein each stage comprises a first latch including first and second transistors configured to receive complementary input signals and a second latch cascaded with the first latch including first and second transistors configured to receive the complementary input signals, a first biasing transistor connected between the first latch and the terminal for ground potential, a second biasing transistor connected between the second latch and the terminal for supply potential, the first biasing transistor controlled by a signal increasing with temperature and the second biasing transistor controlled by a signal decreasing with temperature, a third and a fourth biasing transistor connected in a feedback path of the second latch, the third and fourth feedback transistors controlled by the signal increasing with temperature.

13. The temperature sensor of claim 12, further comprising a bias circuit having a first bias terminal operable to provide a bias signal increasing with temperature, the first bias terminal connected to one or more stages of at least one of the first and second ring oscillators and having a second bias terminal operable to provide another bias signal decreasing with temperature, the second bias terminal connected to one or more stages of at least the other one of the first and second ring oscillators.

14. An integrated circuit comprising an electronic digital circuit and further comprising the temperature sensor of claim 1, wherein the temperature sensor is connected to the electronic digital circuit to control operation of the electronic circuit in dependence on the temperature determined by the temperature sensor.

15. The integrated circuit of claim 14, wherein the electronic digital circuit comprises an oscillator configured to control digital operation of the electronic digital circuit, wherein the oscillator is further configured for temperature calibration in response to the temperature determined by the temperature sensor.

\* \* \* \* \*